(12) United States Patent
Kwon et al.

(10) Patent No.: US 11,735,566 B2
(45) Date of Patent: Aug. 22, 2023

(54) SEMICONDUCTOR PACKAGE

(71) Applicant: SAMSUNG ELECTRONICS CO., LTD., Suwon-si (KR)

(72) Inventors: Ohguk Kwon, Asan-si (KR); Namhoon Kim, Gunpo-si (KR); Hyoeun Kim, Cheonan-si (KR); Sunkyoung Seo, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 99 days.

(21) Appl. No.: 17/375,511

(22) Filed: Jul. 14, 2021

(65) Prior Publication Data
US 2022/0157780 A1   May 19, 2022

(30) Foreign Application Priority Data

Nov. 13, 2020  (KR) .......................... 10-2020-0151768

(51) Int. Cl.
*H01L 25/065* (2023.01)
*H01L 23/538* (2006.01)

(52) U.S. Cl.
CPC ...... *H01L 25/0657* (2013.01); *H01L 23/5384* (2013.01); *H01L 23/5385* (2013.01); *H01L 23/5386* (2013.01)

(58) Field of Classification Search
CPC . H01L 25/043; H01L 25/0657; H01L 25/074; H01L 25/0756; H01L 25/117; H01L 2225/06503–06596; H01L 2225/06541–06544; H01L 2224/0401; H01L 2224/022–02215; H01L 2224/0391; H01L 2224/03916; H01L 2224/1148; H01L 2224/1191; H01L 2224/11916; H01L 2224/2748; H01L 2224/2791; H01L 2224/27916; H01L 2224/08165; H01L 2224/16165; H01L 2224/16235; H01L 2224/32165; H01L 2224/32235; H01L 2224/40165; H01L 2224/40235;
(Continued)

(56) References Cited

U.S. PATENT DOCUMENTS 6,443,351 B1 * 9/2002 Huang ................. H05K 3/3436
                                                                        228/103
7,180,183 B2 * 2/2007 Tsai .................. H01L 23/49816
                                                                        257/E23.079
(Continued)

FOREIGN PATENT DOCUMENTS

KR       10-0840788 B1      6/2008

*Primary Examiner* — Victor A Mandala
*Assistant Examiner* — Lawrence C Tynes, Jr.
(74) *Attorney, Agent, or Firm* — Lee IP Law, P.C.

(57) ABSTRACT

A semiconductor package including a substrate; a first semiconductor chip on the substrate; a second semiconductor chip on the first semiconductor chip; and at least one connection terminal between the first semiconductor chip and the second semiconductor chip, wherein the first semiconductor chip includes a first semiconductor chip body; and at least one upper pad on a top surface of the first semiconductor chip body and in contact with the at least one connection terminal, the at least one upper pad includes a recess that is downwardly recessed from a top surface thereof, and a depth of the recess is less than a thickness of the at least one upper pad.

19 Claims, 14 Drawing Sheets

(58) Field of Classification Search
CPC . H01L 2224/48165; H01L 2224/48235; H01L 2224/81385; H01L 2224/16155–16168; H01L 2224/16225–1624; H01L 2224/24155; H01L 2224/24225–24227; H01L 2224/32455–32168; H01L 2224/32225–3224; H01L 2224/40155–40165; H01L 2224/40225–4024; H01L 2224/13009; H01L 2224/13025; H01L 2224/16146; H01L 2224/73103–73104; H01L 2224/73153; H01L 2224/3203; H01L 2224/73209; H01L 2224/73253–7326; H01L 2224/0603; H01L 2224/06051; H01L 2224/06102; H01L 2224/06505; H01L 2224/06515–06519; H01L 21/76801–76837; H01L 23/5329–53295; H01L 23/49827; H01L 23/5384; H01L 23/5386; H01L 23/13; H01L 24/06; H01L 24/09

See application file for complete search history.

(56) References Cited

U.S. PATENT DOCUMENTS

| | | | | |
|---|---|---|---|---|
| 7,952,199 | B2* | 5/2011 | Jo | H01L 23/49816 174/262 |
| 8,008,786 | B2* | 8/2011 | Pham | H05K 1/111 438/615 |
| 10,700,030 | B2* | 6/2020 | Lin | H01L 24/09 |
| 2008/0128882 | A1* | 6/2008 | Baek | H01L 25/50 438/109 |
| 2012/0292746 | A1* | 11/2012 | Lee | H01L 21/76898 257/621 |
| 2015/0001704 | A1* | 1/2015 | Lu | H01L 24/81 257/737 |
| 2015/0061120 | A1* | 3/2015 | Yang | H01L 25/0657 257/737 |
| 2017/0338206 | A1* | 11/2017 | Seo | H01L 25/0657 |
| 2018/0006006 | A1* | 1/2018 | Kim | H01L 24/33 |
| 2019/0096839 | A1* | 3/2019 | Lin | H01L 24/14 |
| 2019/0206841 | A1* | 7/2019 | Kim | H01L 25/0657 |
| 2021/0098405 | A1* | 4/2021 | Chu | H01L 23/3192 |
| 2021/0351142 | A1* | 11/2021 | Yeh | H01L 21/02063 |

* cited by examiner

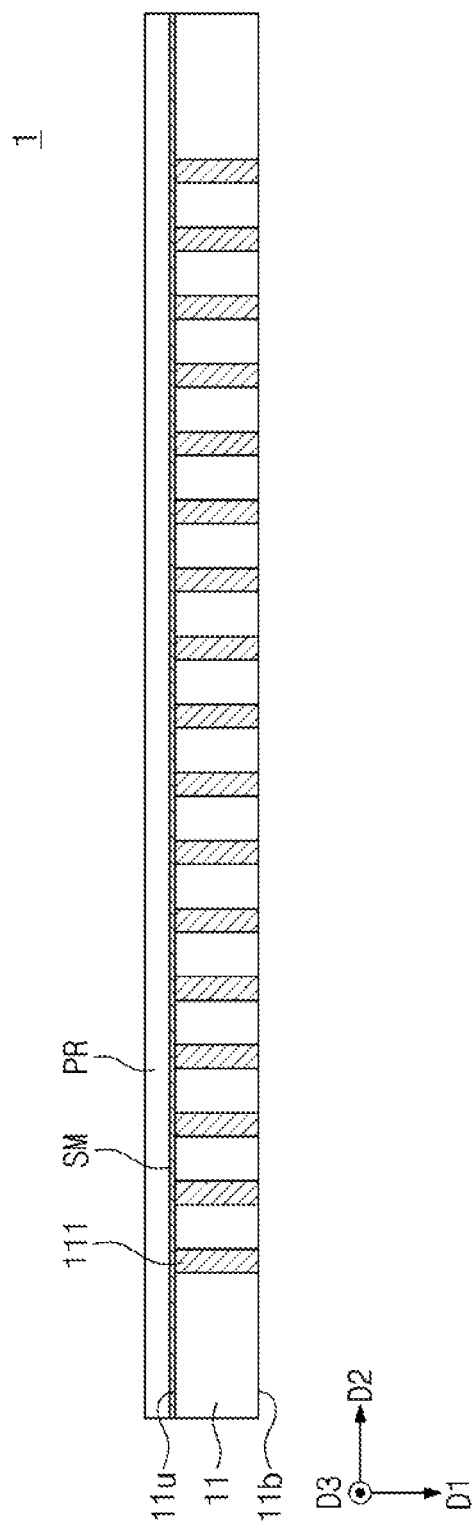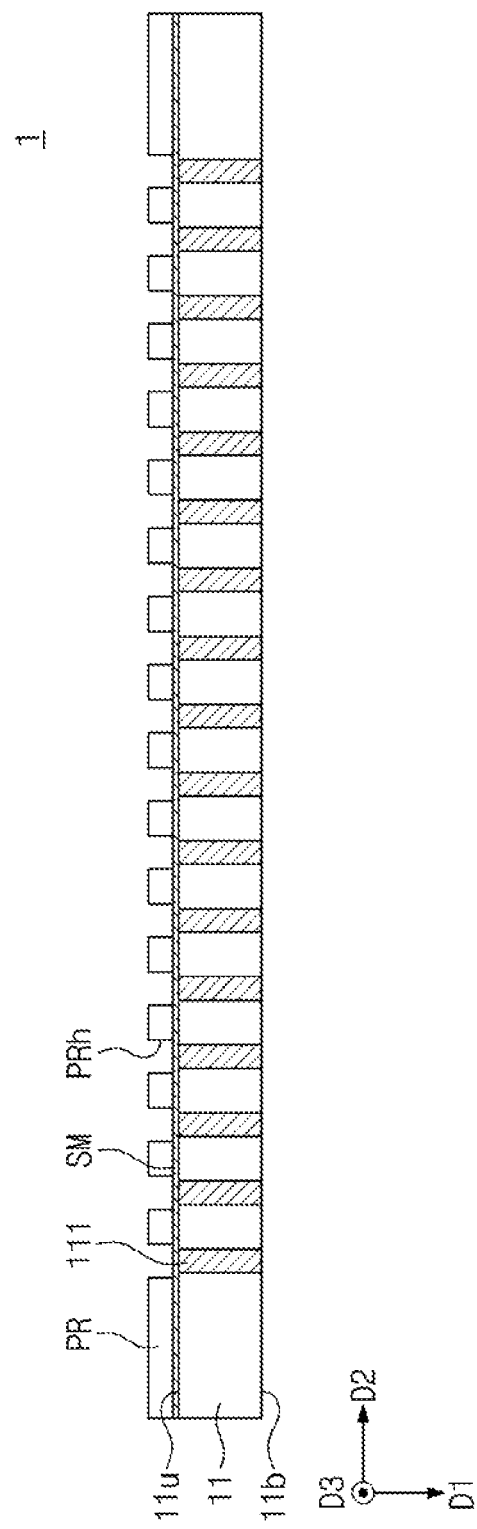

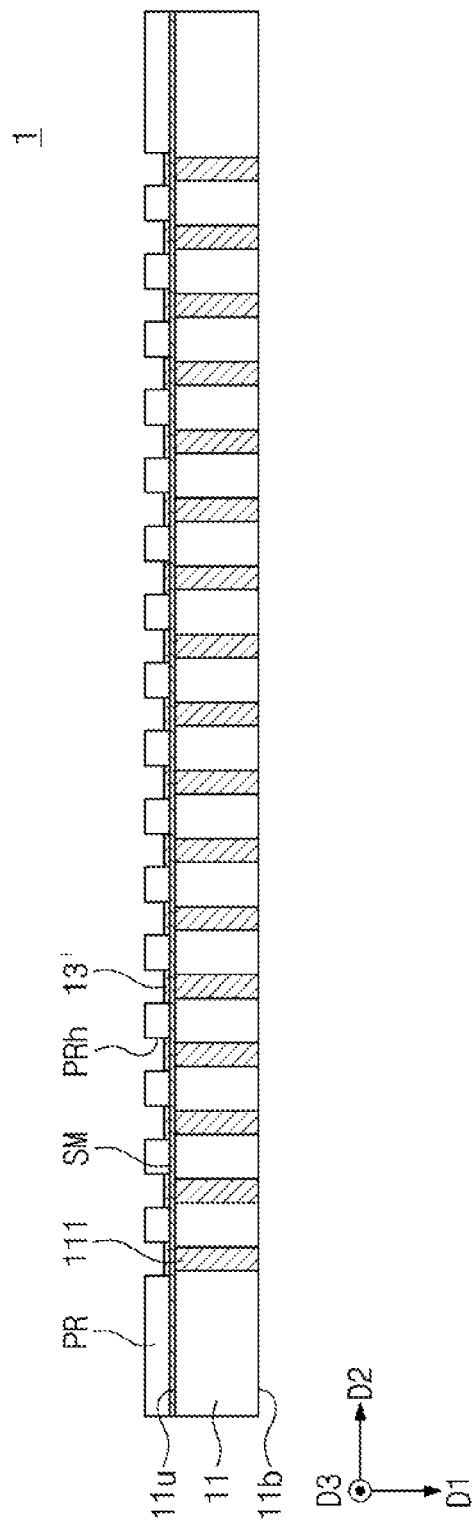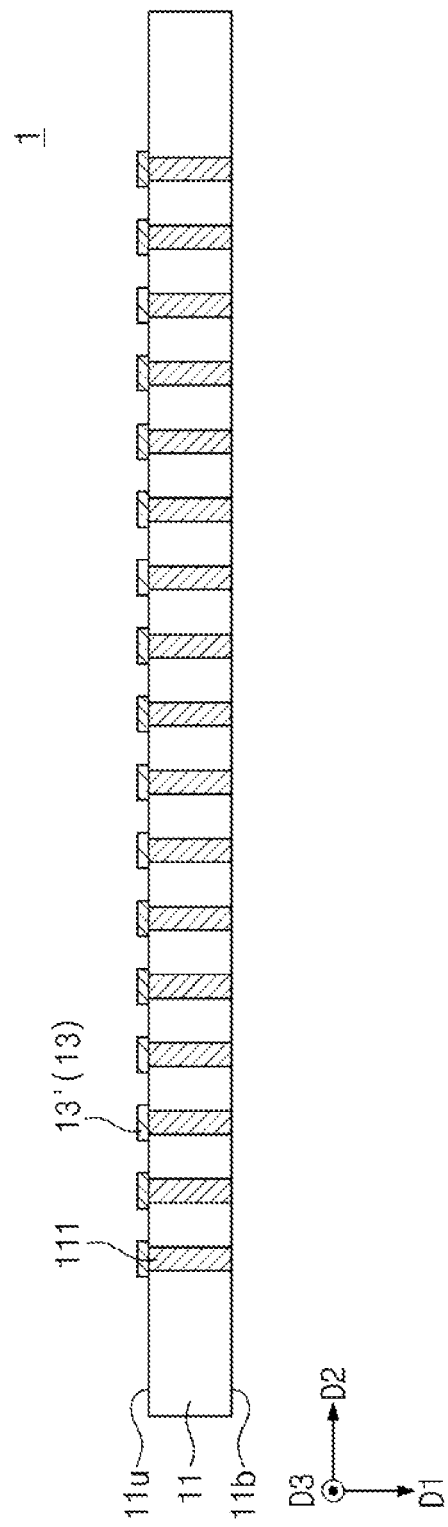

SEMICONDUCTOR PACKAGE

CROSS-REFERENCE TO RELATED APPLICATION

Korean Patent Application No. 10-2020-0151768 filed on Nov. 13, 2020 in the Korean Intellectual Property Office, and entitled: "Semiconductor Package," is incorporated by reference herein in its entirety.

BACKGROUND

1. Field

Embodiments relate to a semiconductor package.

2. Description of the Related Art

A semiconductor package may be provided to implement an integrated circuit chip for use in electronic products. The semiconductor package may be manufactured by mounting a semiconductor chip on a substrate such as a printed circuit board (PCB) or a redistribution layer (RDL). A plurality of semiconductor chips may be mounted on a single semiconductor package. For example, a plurality of semiconductor chips may be vertically stacked on one substrate. The vertically stacked semiconductor chips may be electrically connected to each other through solder balls or the like.

SUMMARY

The embodiments may be realized by providing a semiconductor package including a substrate; a first semiconductor chip on the substrate; a second semiconductor chip on the first semiconductor chip; and at least one connection terminal between the first semiconductor chip and the second semiconductor chip, wherein the first semiconductor chip includes a first semiconductor chip body; and at least one upper pad on a top surface of the first semiconductor chip body and in contact with the at least one connection terminal, the at least one upper pad includes a recess that is downwardly recessed from a top surface thereof, and a depth of the recess is less than a thickness of the at least one upper pad.

The embodiments may be realized by providing a semiconductor package including a first chip; a second chip on the first chip; and at least one connection terminal between the first chip and the second chip, wherein the first chip includes a first chip body; and at least one upper pad on a top surface of the first chip body and connected to the at least one connection terminal, the at least one upper pad includes an upper pad body; a recess that is downwardly recessed from a top surface of the upper pad body; and an extension aperture that laterally extends from the recess and penetrates in a horizontal direction through the upper pad body, and a portion of the at least one connection terminal is in the recess.

The embodiments may be realized by providing a semiconductor package including a substrate; a first semiconductor chip on the substrate; a second semiconductor chip on the first semiconductor chip; and connection terminals between the first semiconductor chip and the second semiconductor chip, wherein the first semiconductor chip includes a first semiconductor chip body; and upper pads on a top surface of the first semiconductor chip body and connected to the connection terminals, the upper pads include a first upper pad on a first region at a center of the top surface of the first semiconductor chip body; a plurality of second upper pads on a second region outside the first region; and a plurality of third upper pads on a third region outside the second region, the first upper pad includes a first upper pad body; a first recess that is downwardly recessed from a top surface of the first upper pad body; and a first extension aperture that laterally extends from the first recess and penetrates in a horizontal direction through the first upper pad body, each of the second upper pads includes a second upper pad body; a second recess that is downwardly recessed from a top surface of the second upper pad body; and a second extension aperture that laterally extends from the second recess and penetrates in a horizontal direction through the second upper pad body, a width of the first recess is greater than a width of the second recess, the connection terminals include a first connection terminal connected to the first upper pad; a plurality of second connection terminals connected to corresponding second upper pads; and a plurality of third connection terminals connected to corresponding third upper pads, and a portion of the first connection terminal is in the first recess.

BRIEF DESCRIPTION OF THE DRAWINGS

Features will be apparent to those of skill in the art by describing in detail exemplary embodiments with reference to the attached drawings in which:

FIGS. 6 to 17 illustrate cross-sectional views of stages in the semiconductor package fabrication method according to the flow chart of FIG. 5.

DETAILED DESCRIPTION

Figure 1:
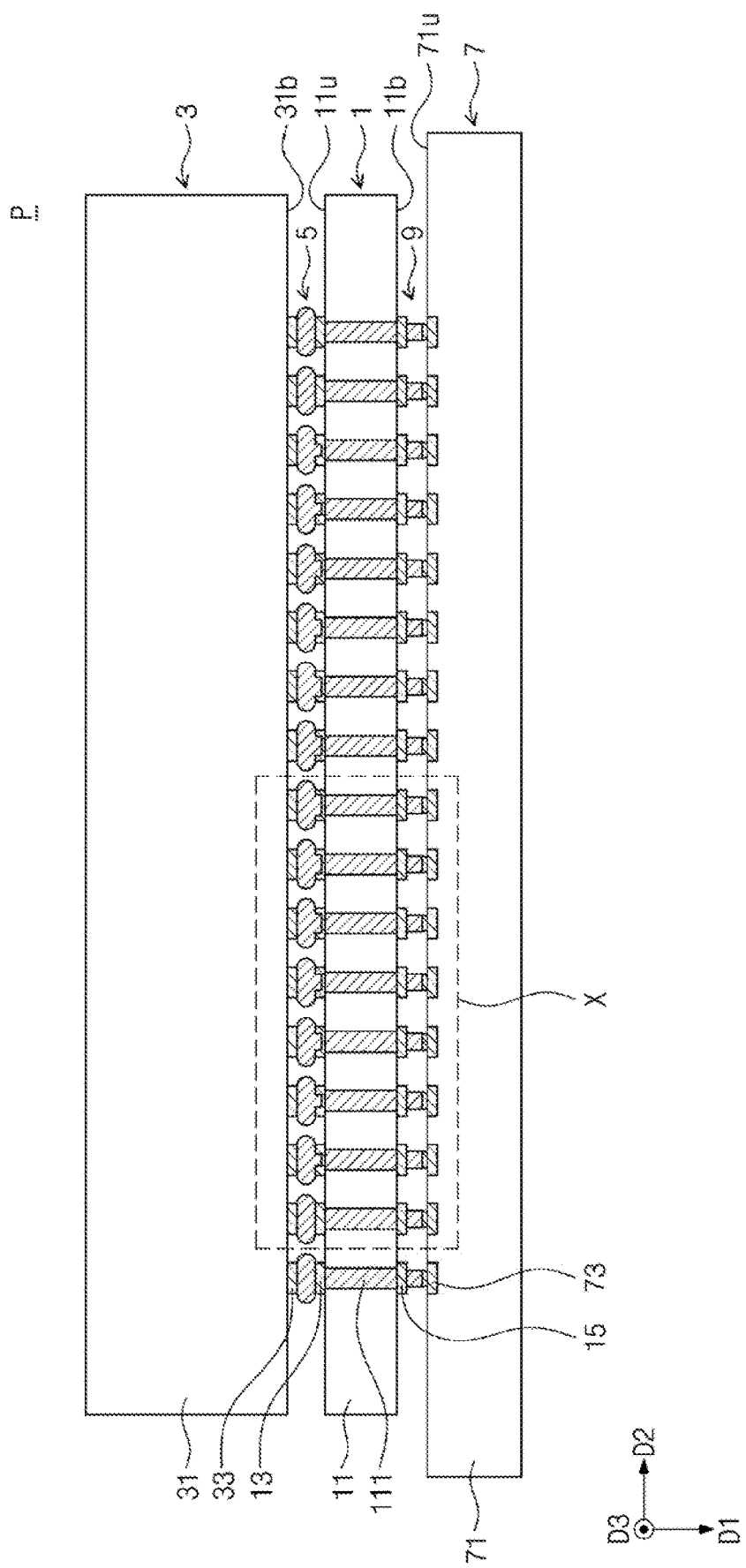
FIG. 1 illustrates a cross-sectional view of a semiconductor package according to some example embodiments.
Figure 2:
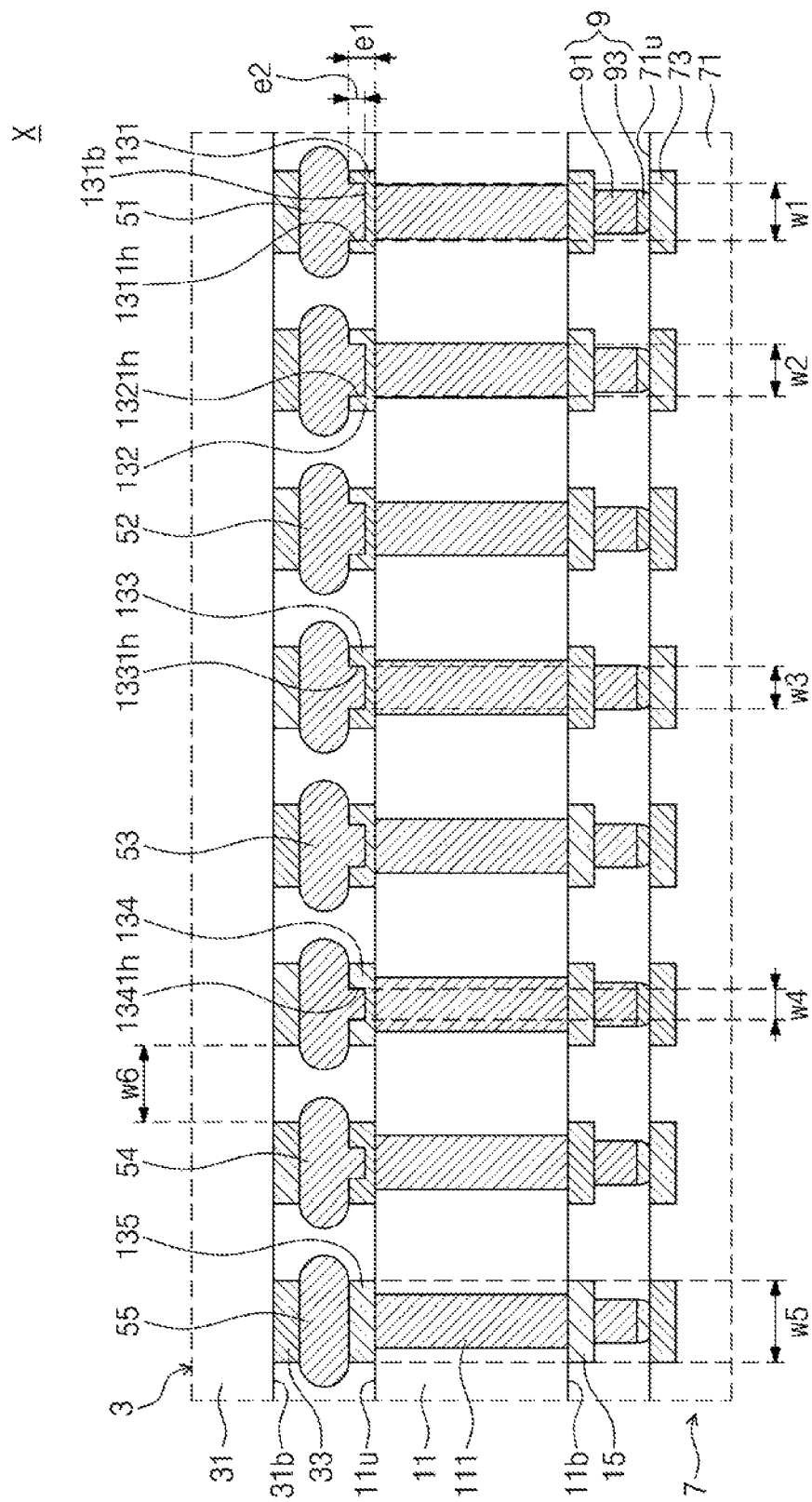
FIG. 2 illustrates an enlarged cross-sectional view of section X of the semiconductor package depicted in FIG. 1.

FIG. 1 illustrates a cross-sectional view of a semiconductor package according to some example embodiments. FIG. 2 illustrates an enlarged cross-sectional view of section X of the semiconductor package depicted in FIG. 1.

In this description below, symbols D1, D2, and D3 of FIG. 1 are respectively a first direction, a second direction that intersects the first direction D1, and a third direction that intersects the first direction D1 and the second direction D2.

Referring to FIGS. 1 and 2, a semiconductor package P may be provided. The semiconductor package P may include a substrate 7, a lower connection terminal 9, a first semiconductor chip 1, a connection terminal 5, and a second semiconductor chip 3.

The substrate 7 may connect the first and second semiconductor chips 1 and 3 to the outside. In an implementation, the first and second semiconductor chips 1 and 3 may be electrically connected through the substrate 7 to the outside. The substrate 7 may include one or more of a printed circuit board (PCB) and a redistribution layer (RDL) substrate. The substrate 7 may include a substrate body 71 and a substrate pad 73. The substrate body 71 may have a wiring structure therein. The substrate pad 73 may be on a top surface 71*u* (e.g., surface facing the first semiconductor chip 1) of the substrate body 71. The substrate pad 73 may be bonded to the lower connection terminals 9. The substrate pad 73 may be electrically connected through the lower connection terminal 9 to the first semiconductor chip 1. The substrate pad 73 may be provided in plural. The plurality of substrate pads 73 may be spaced apart from each other in the second direction D2 and the third direction D3. For convenience, the following will discuss a single substrate pad 73.

The lower connection terminal 9 may be bonded to the substrate pad 73. Referring to FIG. 2, the lower connection terminal 9 may include a connection pillar 91 and a connection ball 93. The connection pillar 91 may extend (e.g., lengthwise) in the first direction D1. The connection pillar 91 may include a conductive material, e.g., copper (Cu). The connection ball 93 may be bonded to a bottom surface (e.g., substrate 7-facing surface) of the connection pillar 91. The connection pillar 91 may be electrically connected through the connection ball 93 to the substrate pad 73. The connection ball 93 may include a solder ball or the like. In an implementation, the lower connection terminal 9 may be provided in plural. In an implementation, the number of a plurality of lower connection terminals 9 may be substantially identical or similar to that of a plurality of substrate pads 73. For convenience, the following will discuss a single lower connection terminal 9.

Referring back to FIG. 1, the first semiconductor chip 1 may be on the substrate 7. The first semiconductor chip 1 may be of various kinds. In an implementation, the first semiconductor chip 1 may include a logic chip. In an implementation, the first semiconductor chip 1 may be of a different type from that discussed above. The first semiconductor chip 1 may include a first semiconductor chip body 11, a lower pad 15, and an upper pad 13. The first semiconductor chip body 11 may have a through silicon via (TSV) 111 therein. The TSV 111 may extend (e.g., lengthwise) in the first direction D1. The TSV 111 may electrically connect the lower pad 15 to the upper pad 13. The lower pad 15 may be on a bottom surface 11*b* (e.g., substrate 7-facing surface) of the first semiconductor chip body 11. The lower pad 15 may be connected to the lower connection terminal 9. The upper pad 13 may be on a top surface 11*u* (e.g., second semiconductor chip 3-facing surface) of the first semiconductor chip body 11. Referring back to FIG. 2, the upper pad 13 may include a first upper pad 131, a second upper pad 132, a third upper pad 133, a fourth upper pad 134, and a fifth upper pad 135. The first upper pad 131 may be in or on an inner side (e.g., relatively toward an interior) of the top surface 11*u* of the first semiconductor chip body 11. The first upper pad 131 may include a first recess 1311*h*. The first recess 1311*h* may be a space that is downwardly or inwardly recessed from a top surface of the first upper pad 131. The first recess 1311*h* may have a first width w1 (e.g., in the second direction D2). The first upper pad 131 may have a first thickness e1 (e.g., in the first direction D1). In an implementation, the first thickness e1 may be about 2 μm to about 4 μm. The first recess 1311*h* may have a depth (e.g., a second thickness) e2 in the first direction D1. The depth e2 of the first recess 1311*h* may be less than the first thickness e1 of the first upper pad 131. The first recess 1311*h* may not completely penetrate the first upper pad 131. In an implementation, the first recess 1311*h* may not expose the TSV 111. In an implementation, a lower portion or bottom of the first recess 1311*h* may be defined by a first recess surface 131*b*. In an implementation, the first recess surface 131*b* may be downwardly or inwardly recessed from the top surface of the first upper pad 131 and may correspond to a lower boundary or bottom of the first recess 1311*h*.

The second upper pad 132 may be on the top surface 11*u* of the first semiconductor chip body 11 and outside (e.g., closer to an edge of the first semiconductor chip 1 in the second direction D2 relative to) the first upper pad 131. The second upper pad 132 may include a second recess 1321*h*. The second recess 1321*h* may be a space that is downwardly recessed from a top surface of the second upper pad 132. The second recess 1321*h* may have a second width w2 (e.g., in the second direction D2). The second upper pad 132 may have a thickness (e.g., in the first direction D1) substantially identical or similar to that of the first upper pad 131. In an implementation, the second recess 1321*h* may have a depth substantially identical or similar to that of the first recess 1311*h*.

The third upper pad 133 may be on the top surface 11*u* of the first semiconductor chip body 11 and outside (e.g., at an outer side of) the second upper pad 132. The third upper pad 133 may include a third recess 1331*h*. The third recess 1331*h* may be a space that is downwardly recessed from a top surface of the third upper pad 133. The third recess 1331*h* may have a third width w3 (e.g., in the second direction D2). The third upper pad 133 may have a thickness substantially identical or similar to that of the first upper pad 131. In an implementation, the third recess 1331*h* may have a depth substantially identical or similar to that of the first recess 1311*h*.

The fourth upper pad 134 may be on the top surface 11*u* of the first semiconductor chip body 11 and outside the third upper pad 133. The fourth upper pad 134 may include a fourth recess 1341*h*. The fourth recess 1341*h* may be a space that is downwardly recessed from a top surface of the fourth upper pad 134. The fourth recess 1341*h* may have a fourth width w4 (e.g., in the second direction D2). The fourth upper pad 134 may have a thickness substantially identical or similar to that of the first upper pad 131. In addition, the fourth recess 1341*h* may have a depth substantially identical or similar to that of the first recess 1311*h*.

The fifth upper pad 135 may be on the top surface 11*u* of the first semiconductor chip body 11 and outside the fourth upper pad 134. The fifth upper pad 135 may not include a recess. The fifth upper pad 135 may have a fifth width w5 (e.g., in the second direction D2).

In an implementation, each of the first, second, third, and fourth widths w1, w2, w3, and w4 may be about 3 μm to about 15 μm. In an implementation, within about 3 μm to about 15 μm, the first to fourth widths w1 to w4 may have widths that decrease in the foregoing sequence (e.g., w4<w3<w2<w1). In an implementation, the fifth width w5 may be about 15 μm to about 20 μm. A sixth width w6 may be a distance between neighboring two of a plurality of upper pads 13 (e.g., the distance in the second direction D2 between facing sides of adjacent ones of the upper pads 13). In an implementation, the sixth width w6 may be about 20 μm to about 40 μm. The first, second, third, fourth, and fifth upper pads 131, 132, 133, 134, and 135 will be further discussed in detail below.

Referring again to FIG. 1, the connection terminal 5 may be on the upper pad 13. The connection terminal 5 and the upper pad 13 may be in contact (e.g., direct contact) with each other and electrically connected to each other. The upper pad 13 may include a solder ball or the like. Referring again to FIG. 2, the connection terminal 5 may include a first connection terminal 51, a second connection terminal 52, a third connection terminal 53, a fourth connection terminal 54, and a fifth connection terminal 55. The first connection terminal 51 may be bonded to the first upper pad 131. The first connection terminal 51 may have a portion in the first recess 1311h. The first connection terminal 51 may be in contact (e.g., direct contact) with the first recess surface 131b downwardly recessed from the top surface of the first upper pad 131. The second connection terminal 52 may be bonded to the second upper pad 132. The second connection terminal 52 may have a portion in the second recess 1321h. The third connection terminal 53 may be bonded to the third upper pad 133. The third connection terminal 53 may have a portion in the third recess 1331h. The fourth connection terminal 54 may be bonded to the fourth upper pad 134. The fourth connection terminal 54 may have a portion in the fourth recess 1341h. The fifth connection terminal 55 may be bonded to the fifth upper pad 135. Other connection terminals (see 5 of FIG. 1) will be further discussed in detail below.

Referring once again to FIG. 1, the second semiconductor chip 3 may be on the first semiconductor chip 1. In an implementation, the second semiconductor chip 3 may include a static random access memory (SRAM) or the like. The second semiconductor chip 3 may include a second semiconductor chip body 31 and a connection pad 33. The connection pad 33 may be on a bottom surface 31b of the second semiconductor chip body 31. The connection pad 33 may be bonded to the connection terminal 5. In an implementation, the number of a plurality of connection pads 33 may be the same as that of a plurality of connection terminals 5. However, for convenience, the following will discuss a single connection pad 33.

Figure 3:
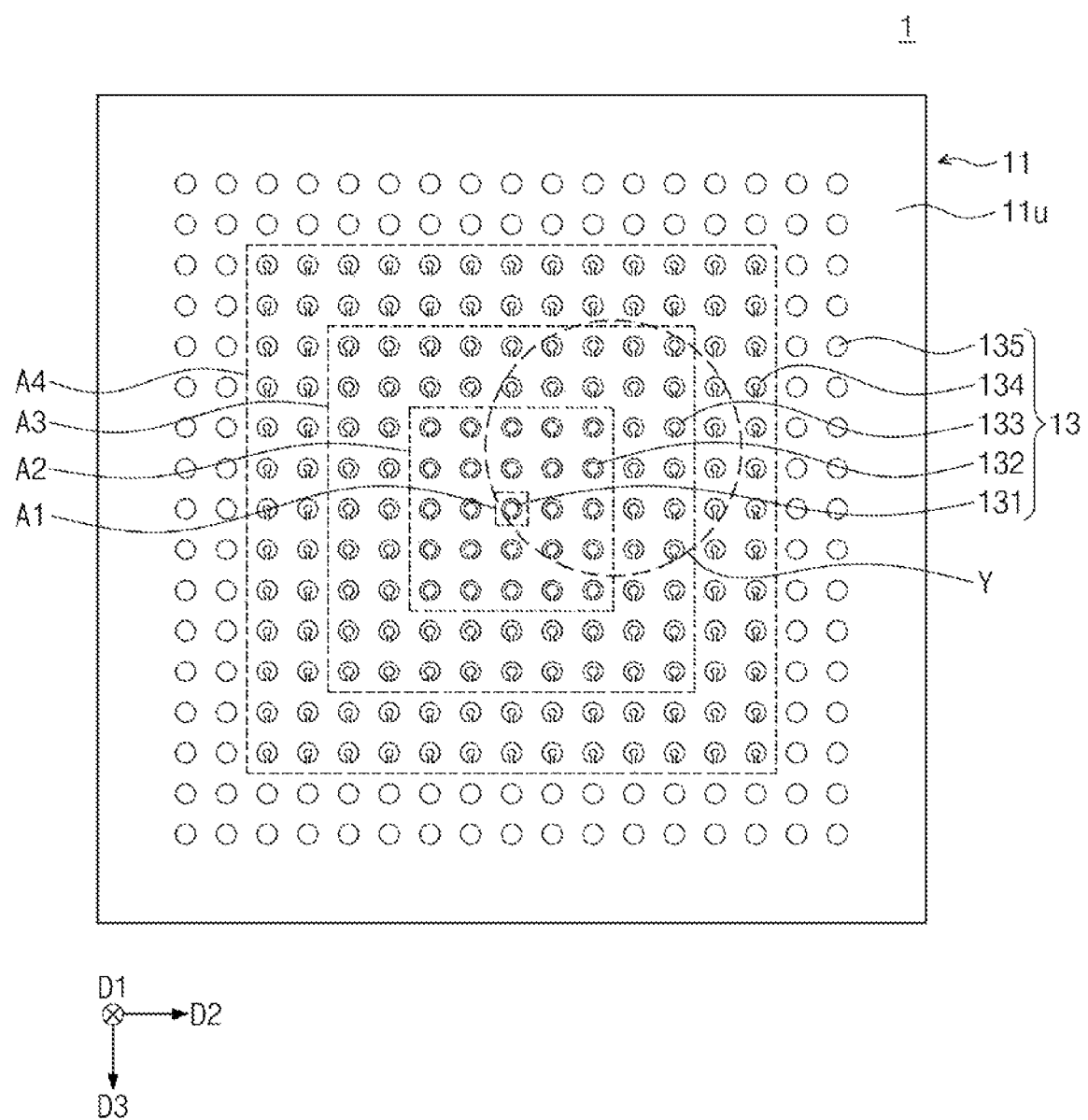
FIG. 3 illustrates a plan view of a first semiconductor chip of a semiconductor package according to some example embodiments.
Figure 4:
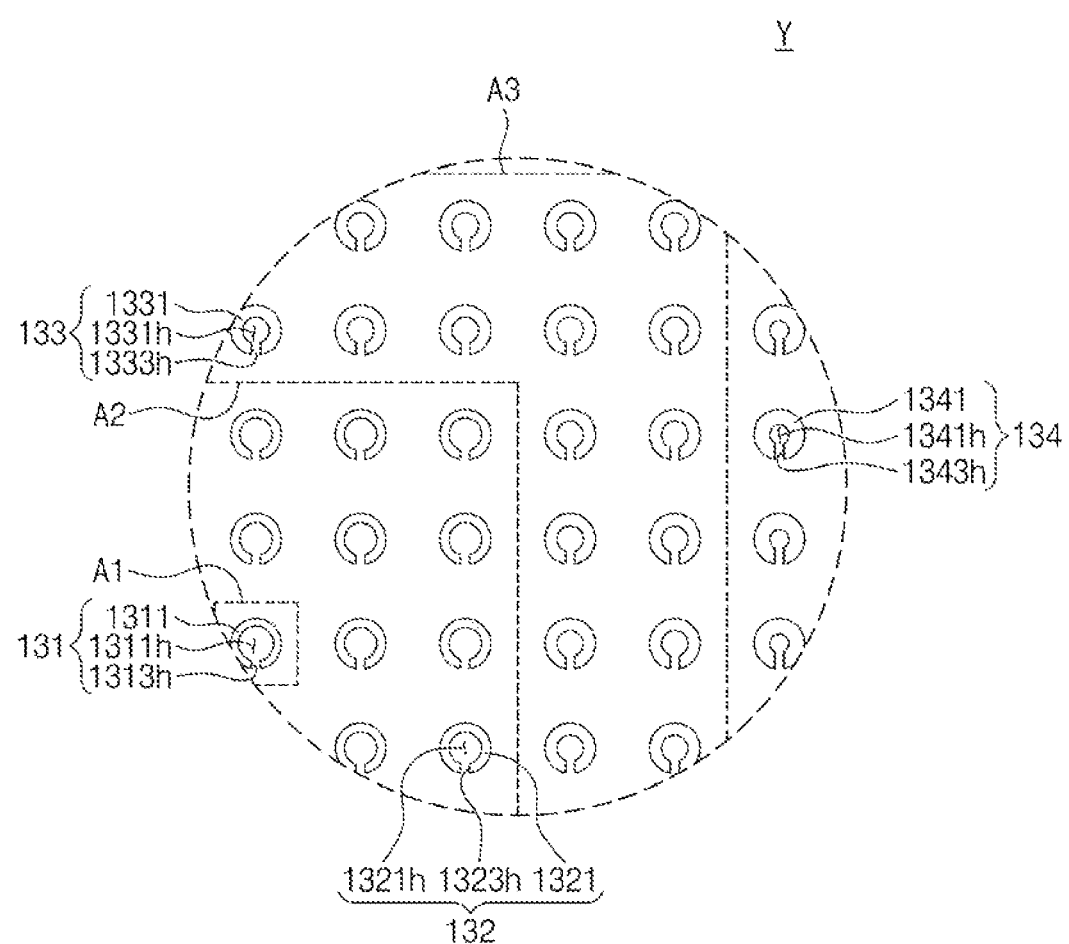
FIG. 4 illustrates an enlarged plan view of section Y of the semiconductor package depicted in FIG. 3.

FIG. 3 illustrates a plan view of a first semiconductor chip of a semiconductor package according to some example embodiments. FIG. 4 illustrates an enlarged plan view of section Y of the semiconductor package depicted in FIG. 3.

Referring to FIG. 3, the top surface 11u of the first semiconductor chip 1 may be divided into a plurality of regions including a first region A1, a second region A2, a third region A3, a fourth region A4, and another region (designated by no numeral).

The first region A1 may indicate an innermost area including a center of the top surface 11u of the first semiconductor chip 1. In an implementation, the first region A1 may have a tetragonal shape. In an implementation, the first region A1 may have a tetragonal shape whose sides are parallel to four sides of the top surface 11u. The upper pad 13 in the first region A1 may be the first upper pad 131. In an implementation, the first upper pad 131 may be on in the first region A1. In an implementation, as illustrated in FIG. 3, only one first upper pad 131 may be on the first region A1. In an implementation, a plurality of first upper pads 131 may be on the first region A1.

On the top surface 11u of the first semiconductor chip 1, the second region A2 may be an area that surrounds the first region A1. In an implementation, the second region A2 may be outside (e.g., at outer sides of) the first region A1. The second region A2 may have a tetragonal shape. The upper pad 13 on the second region A2 may be the second upper pad 132. In an implementation, the second upper pad 132 may be on the second region A2.

On the top surface 11u of the first semiconductor chip 1, the third region A3 may be an area that surrounds the second region A2. In an implementation, the third region A3 may be outside the second region A2. The third region A3 may have a tetragonal shape. The upper pad 13 on the third region A3 may be the third upper pad 133. In an implementation, the third upper pad 133 may be on the third region A3.

On the top surface 11u of the first semiconductor chip 1, the fourth region A4 may be an area that surrounds the third region A3. In an implementation, the fourth region A4 may be outside the third region A3. The fourth region A4 may have a tetragonal shape. The upper pad 13 on the fourth region A4 may be the fourth upper pad 134. In an implementation, the fourth upper pad 134 may be on the fourth region A4.

On the top surface 11u of the first semiconductor chip 1, another region may be an area that surrounds the fourth area A4. In an implementation, the other region may be outside the fourth region A4. The upper pad 13 on the other region may be the fifth upper pad 135. In an implementation, the fifth upper pad 135 may be on the other region.

Referring to FIG. 4, the first upper pad 131 may include a first upper pad body 1311. The first upper pad 131 may further include a first extension aperture 1313h. The first extension aperture 1313h may outwardly extend from the first recess 1311h and may horizontally penetrate the first upper pad body 1311 (e.g., may be a hole or opening in the sidewall of the first upper pad body 1311).

The second upper pad 132 may include a second upper pad body 1321. The second upper pad 132 may further include a second extension aperture 1323h. The second extension aperture 1323h may outwardly extend from the second recess 1321h and may horizontally penetrate the second upper pad body 1321.

The third upper pad 133 may include a third upper pad body 1331. The third upper pad 133 may further include a third extension aperture 1333h. The third extension aperture 1333h may outwardly extend from the third recess 1331h and may horizontally penetrate the third upper pad body 1331.

The fourth upper pad 134 may include a fourth upper pad body 1341. The fourth upper pad 134 may further include a fourth extension aperture 1343h. The fourth extension aperture 1343h may outwardly extend from the fourth recess 1341h and may horizontally penetrate the fourth upper pad body 1341.

In an implementation, the first, second, third, and fourth extension apertures 1313h, 1323h, 1333h, and 1343h may extend or be open in the same direction as each other (e.g., in the third direction D3). In an implementation, the first, second, third, and fourth extension apertures 1313h, 1323h, 1333h, and 1343h may extend or be open in different directions from each other.

In an implementation, one of the first, second, third, and fourth upper pads 131, 132, 133, and 134 may include a corresponding one of the first, second, third, and fourth extension apertures 1313h, 1323h, 1333h, and 1343h. In an implementation, the first upper pad 131 may include a plurality of extension apertures that extend in various directions. In an implementation, the first upper pad 131 may include four extension apertures that extend in four directions from the first recess 1311h. In an implementation, other upper pads 132, 133, and 134, may each include a plurality of extension apertures.

Figure 5:
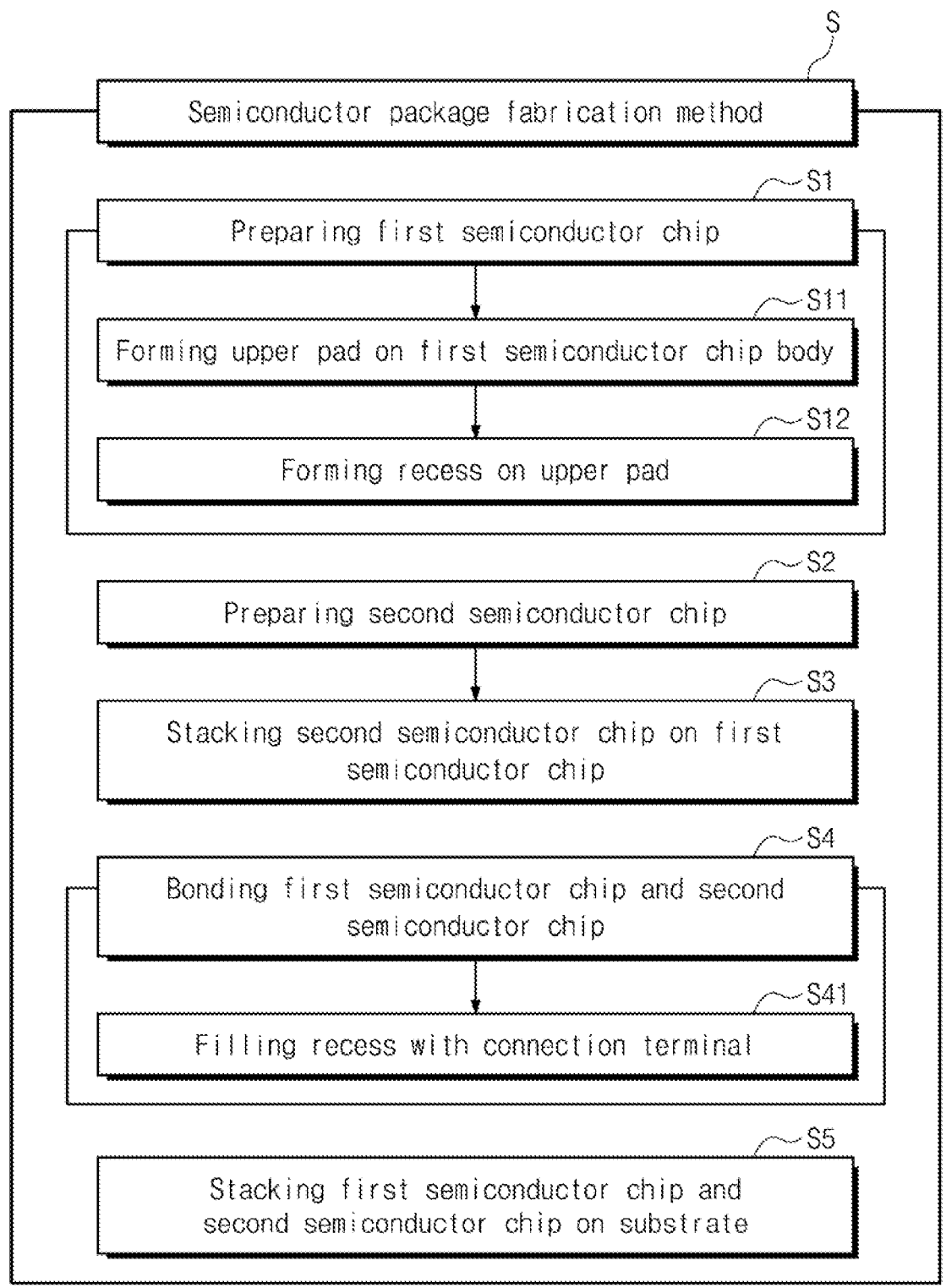
FIG. 5 illustrates a flow chart of a semiconductor package fabrication method according to some example embodiments.

FIG. 5 illustrates a flow chart of a semiconductor package fabrication method according to some example embodiments.

Referring to FIG. 5, a semiconductor package fabrication method S may be provided. The semiconductor package fabrication method S may fabricate a semiconductor package (see P of FIG. 1) discussed with reference to FIGS. 1 to 4. The semiconductor package fabrication method S may include a step S1 of preparing a first semiconductor chip, a step S2 of preparing a second semiconductor chip, a step S3 of stacking the second semiconductor chip on the first semiconductor chip, a step S4 of bonding the first and second semiconductor chips to each other, and a step S5 of stacking the first and second semiconductor chip on a substrate. It is described above that the first and second semiconductor chips are bonded to each other and then are stacked on the substrate, but the fabrication sequence may be changed. In an implementation, the first semiconductor chip may be stacked on the substrate, and then the second semiconductor chip may be stacked on and bonded to the first semiconductor chip.

The step S1 may include a step S11 of forming an upper pad on a first semiconductor chip body and a step S12 of forming a recess on or in the upper pad.

The step S4 may include a step S41 of filling the recess with a connection terminal.

With reference to FIGS. 6 to 17, each step of the semiconductor package fabrication method S will be described in detail.

FIGS. 6 to 17 illustrate cross-sectional views of stages in the semiconductor package fabrication method according to the flow chart of FIG. 5.

Figure 6:
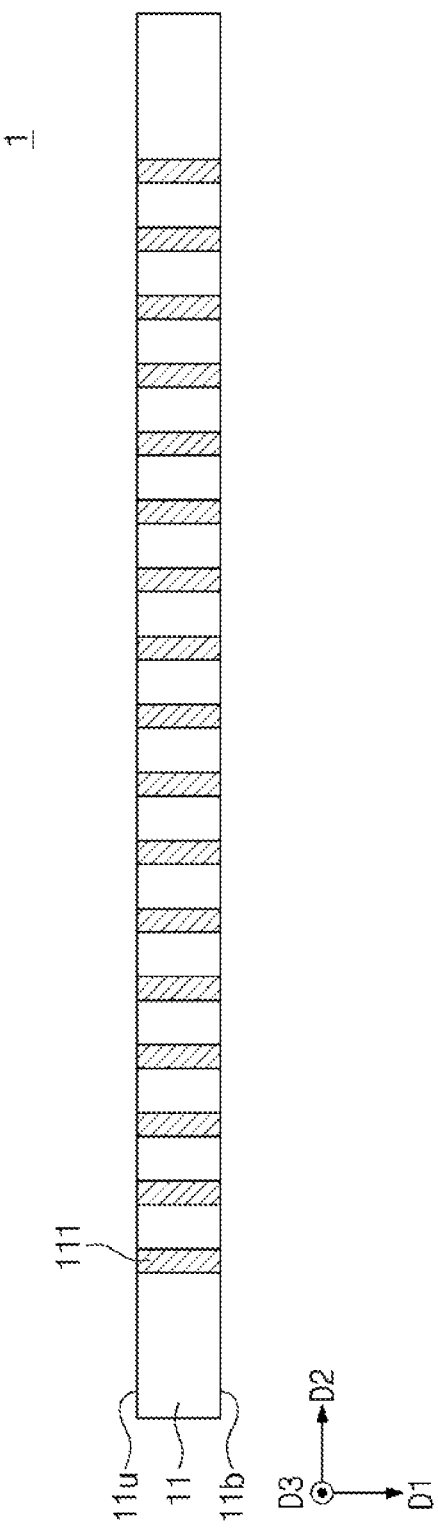

Referring to FIGS. 5 and 6, the step S1 may include preparing a first semiconductor chip 1 including a TSV 111. The TSV 111 may penetrate a first semiconductor chip body 11 in the first direction D1.

Figure 7:
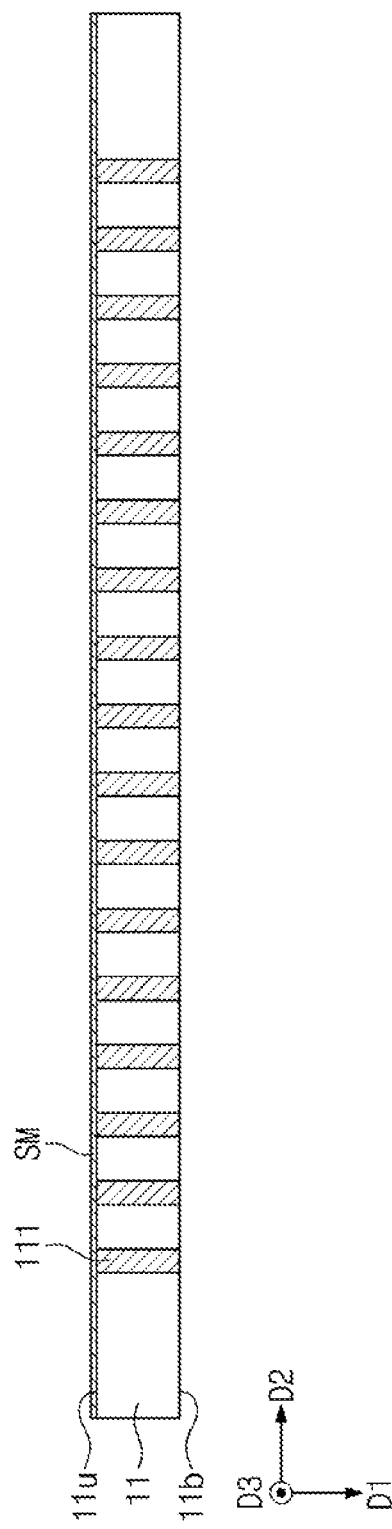

Referring to FIGS. 5 and 7, the step S11 may include forming a seed metal SM on the first semiconductor chip body 11. The seed metal SM may be conformally formed on a top surface 11u of the first semiconductor chip body 11. In an implementation, the seed metal SM may be formed by a deposition process.

Referring to FIG. 8, a mask layer PR may be formed on the seed metal SM. The mask layer PR may include a photosensitive polymer or the like. In an implementation, the mask layer PR may include photosensitive polyimide, polybenzoxazole, phenolic polymer, or benzocyclobutene polymer. In an implementation, the mask layer PR may include other suitable materials. The formation of the mask layer PR may be performed by a coating process, e.g., spin coating or slit coating.

Referring to FIG. 9, the mask layer PR may be patterned. In an implementation, a mask pattern PRh may be formed on the mask layer PR. The mask pattern Pith may expose a portion of the seed metal SM. The patterning of the mask layer PR may be executed by exposure and development processes. The development process may be a positive tone development process or a negative tone development process. The patterning of the mask layer PR may include aligning a photomask on the mask layer PR, performing an exposure process on the mask layer PR, and performing a development process on the exposed mask layer PR.

Referring to FIG. 10, an upper pad 13' may be formed on the seed metal SM exposed by the mask pattern PRh. The formation of the upper pad 13' may be achieved by an electroplating process in which the seed metal SM is used as an electrode.

Referring to FIG. 11, the mask layer (see PR of FIG. 10) may be removed. A strip process may be performed to remove the mask layer PR. After the removal of the mask layer PR, a removal action may be performed on the seed metal (see SM of FIG. 1) that is not covered with or used to form the upper pad 13'. An etching process may be performed to remove the seed metal SM. In an implementation, a wet etching process may be performed to remove the seed metal SM. The seed metal SM under the upper pad 13' may remain without being etched. For convenience in the following description, the upper pad 13' and its underlying seed metal SM may be collectively called an upper pad 13.

Figure 12:
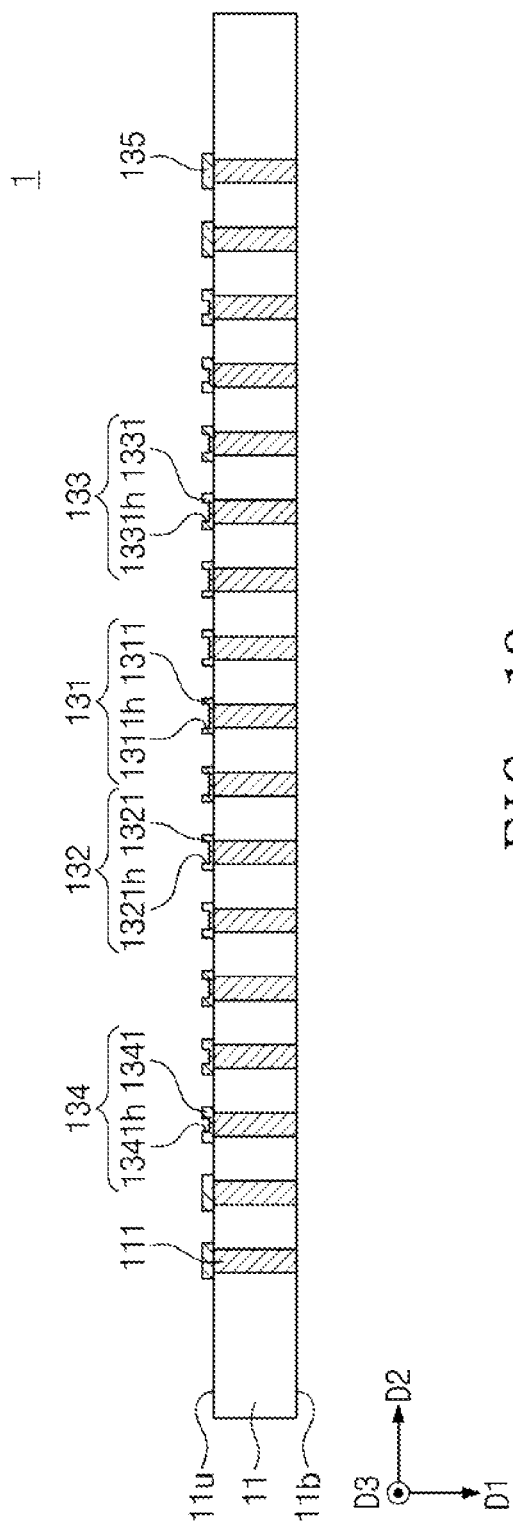
Figure 13:
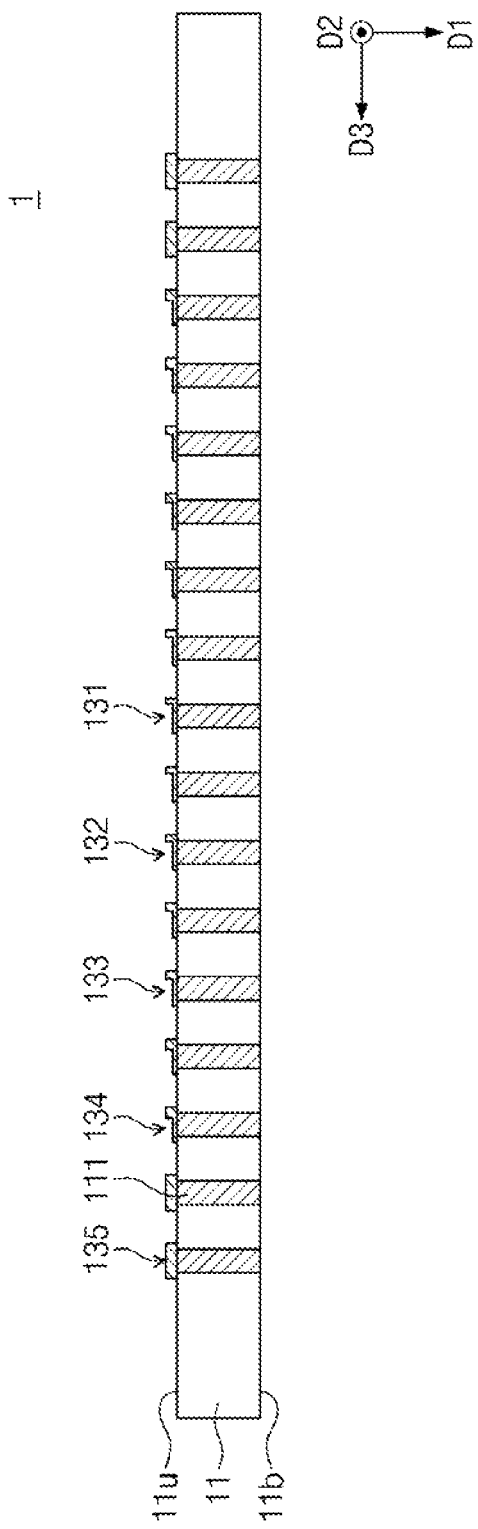

Referring to FIGS. 5, 12, and 13, the step S12 may include forming first, second, third, and fourth recesses 1311h, 1321h, 1331h, and 1341h that are downwardly recessed from top surfaces of first, second, third, and fourth upper pads 131, 132, 133, and 134. Various suitable methods may be used to form the first, second, third, and fourth recesses 1311h, 1321h, 1331h, and 1341h. In an implementation, an etching process may be performed to form the first, second, third, and fourth recesses 1311h, 1321h, 1331h, and 1341h. In an implementation, suitable methods may be employed to form the first, second, third, and fourth recesses 1311h, 1321h, 1331h, and 1341h. One or more extension apertures may be formed simultaneously with the formation of the first, second, third, and fourth recesses 1311h, 1321h, 1331h, and 1341h. In an implementation, an etching process may be performed to form the extension apertures simultaneously with the first, second, third, and fourth recesses 1311h, 1321h, 1331h, and 1341h. The first, second, third, and fourth upper pads 131, 132, 133, and 134 may respectively include first, second, third, and fourth upper pad bodies 1311, 1321, 1331, and 1341. Referring to FIG. 13 showing a cross-section viewed from a different side, the upper pad may have an L-shaped cross-section due to the extension aperture that extends (e.g., outwardly) from the recess.

Figure 14:
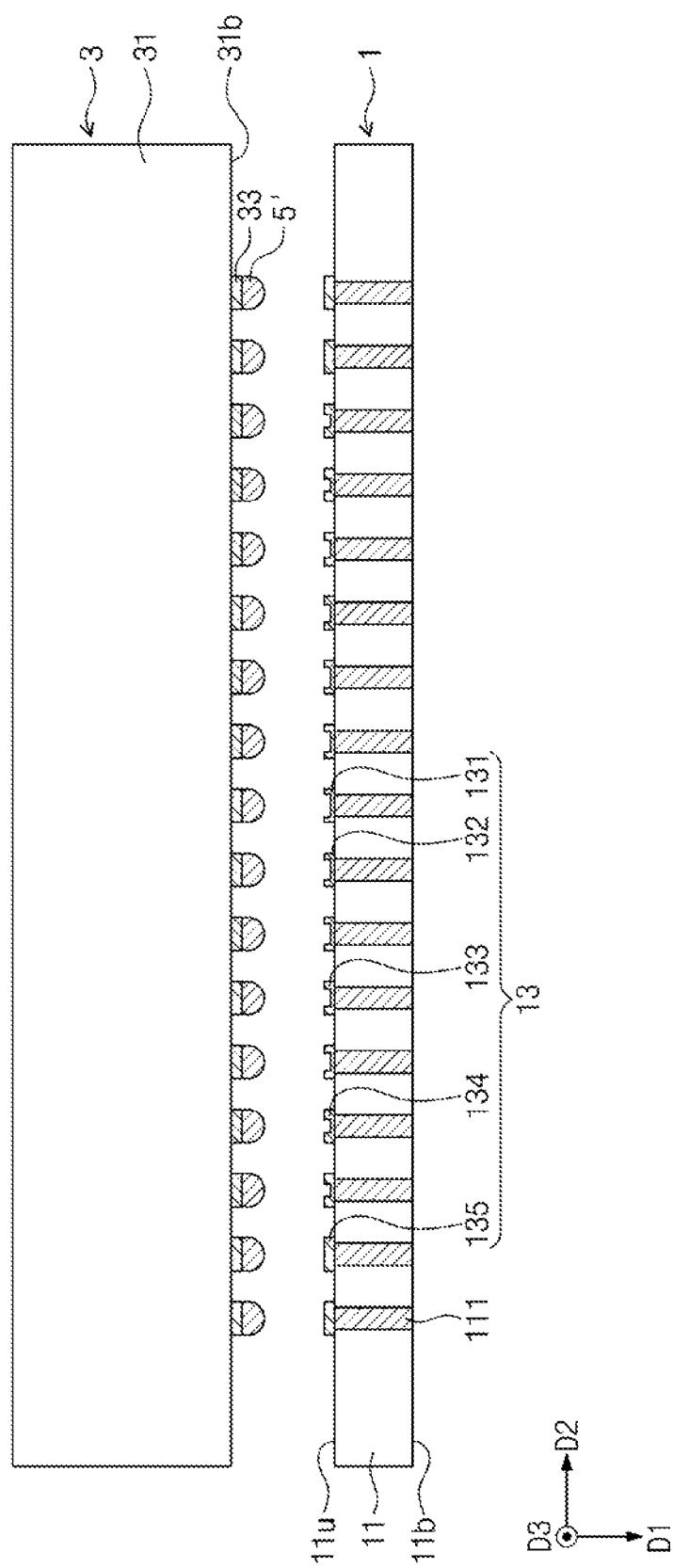

Referring to FIGS. 5 and 14, the step S2 may include bonding a connection terminal 5' to a connection pad 33 of a second semiconductor chip 3. Before the bonding to the connection pad 33, the connection terminal 5' may have a spherical solder ball shape. The second semiconductor chip 3 may be placed on the first semiconductor chip 1.

Figure 15:
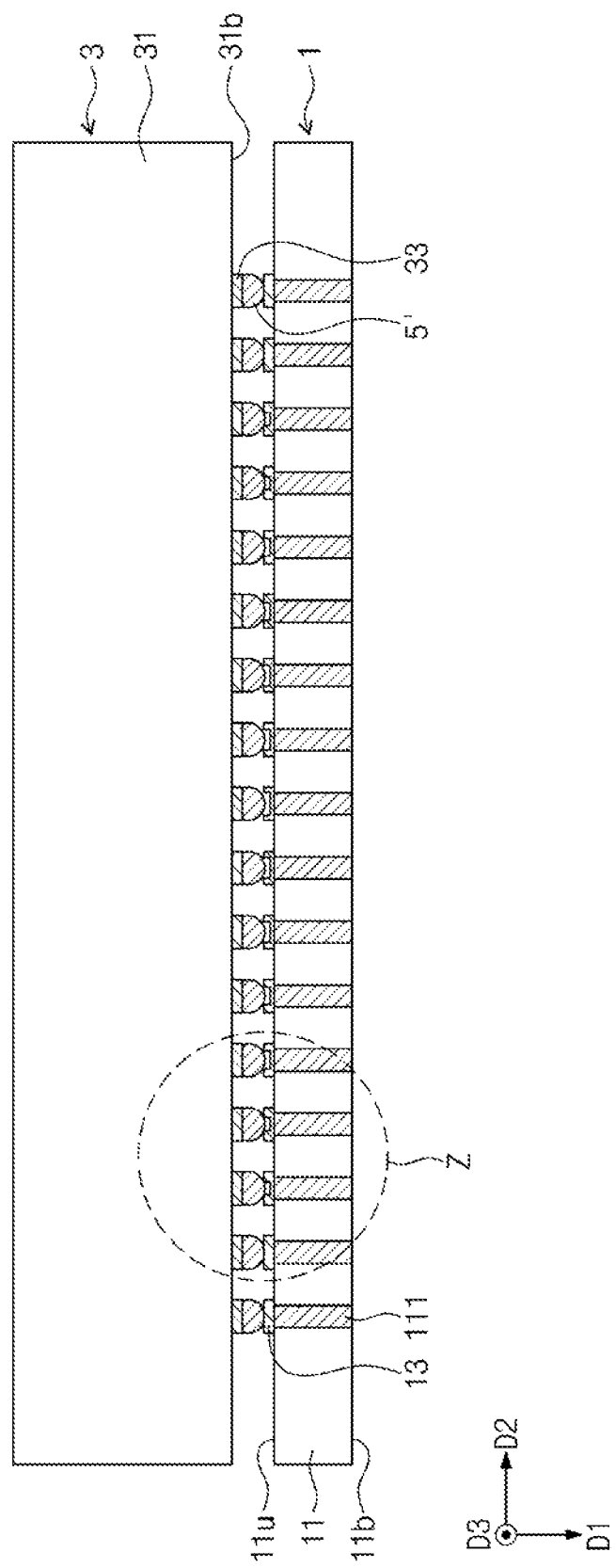

Referring to FIGS. 5 and 15, the step S3 may include stacking the second semiconductor chip 3 on the first semiconductor chip 1 to allow the connection terminal 5' to contact the upper pad 13.

Figure 16:
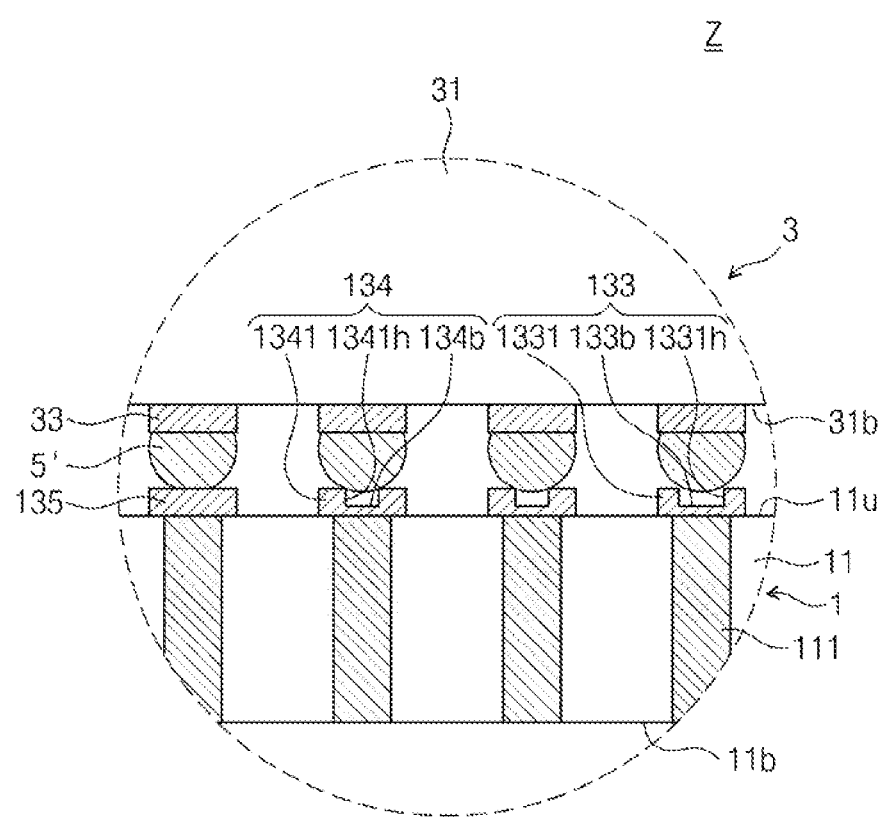

Referring to FIG. 16, the connection terminal 5' on the third upper pad 133 may be in contact with a top surface of the third upper pad body 1331. The third recess 1331h may cause the connection terminal 5' on the third upper pad 133 to upwardly separate (e.g., be spaced apart) from a third recess surface 133b (e.g., the bottom of the recess). The connection terminal 5' on the fourth upper pad 134 may be in contact with a top surface of the fourth upper pad body 1341. The fourth recess 1341h may cause the connection terminal 5' on the fourth upper pad 134 to be spaced apart from a fourth recess surface 134b. The fifth upper pad 135 may not include a recess, and the connection terminal 5' on the fifth upper pad 135 may be in contact with a top surface of the fifth upper pad 135 without a spacing space between the connection terminal 5' and the fifth upper pad 135.

Figure 17:
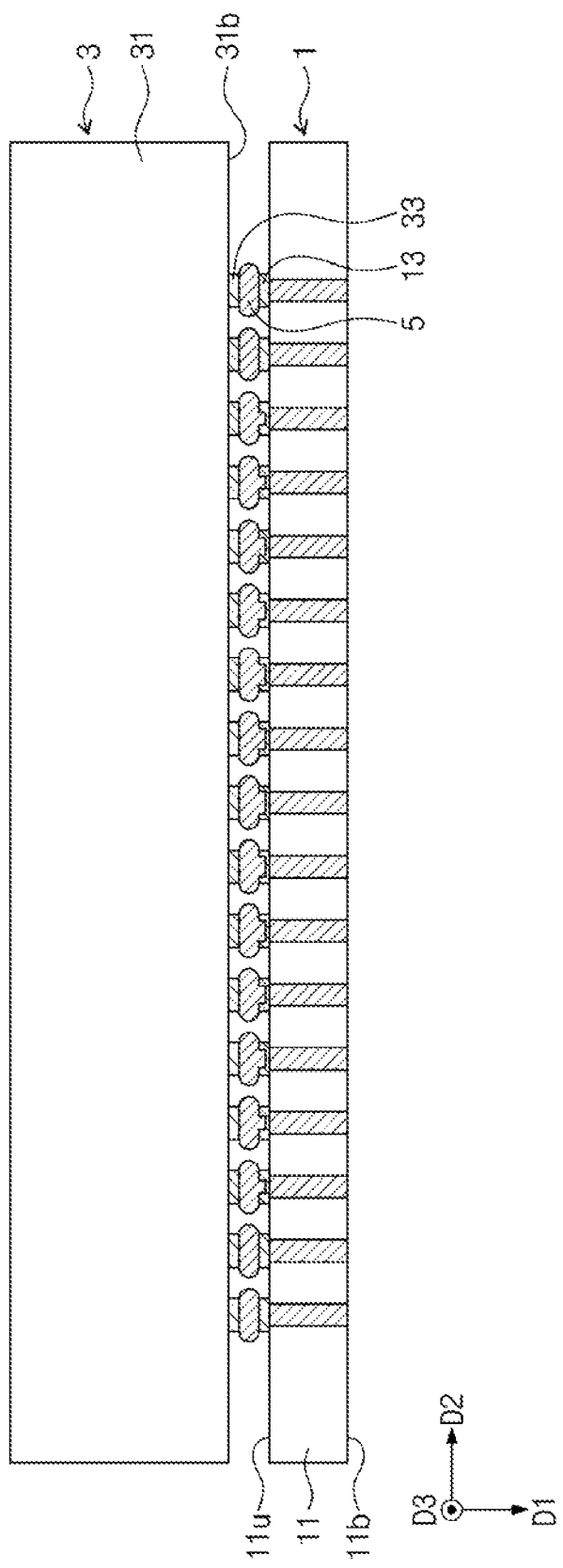

Referring to FIGS. 5 and 17, the step S4 may include pressing the second semiconductor chip 3 against the first semiconductor chip 1. In an implementation, in the step S4, a thermo-compression (TC) process may be performed such that heat is applied while downwardly pressing a top surface of the second semiconductor chip 3.

The step S41 may allow the connection terminal to fill the recess. In an implementation, as the second semiconductor chip 3 is compressed, a spacing distance may disappear between the connection terminal 5' and the third recess surface 133b of the third upper pad 133 discussed with reference to FIG. 16. In an implementation, a portion of the connection terminal 5' may be introduced into the third recess 1331h, and thus the connection terminal 5' and the third recess surface 133b may come into contact (e.g., direct contact) with each other. The first upper pad (see 131 of FIG. 2), the second upper pad (see 132 of FIG. 2), and the fourth upper pad 134 may experience an action similar to that mentioned above. Therefore, recesses may be filled with connection terminals.

Referring back to FIG. 5, the step S5 may include stacking the first and second semiconductor chips on the substrate. Accordingly, a semiconductor package P may be fabricated as discussed with reference to FIG. 1.

In a semiconductor package and its fabrication method in accordance with some example embodiments, a recess may be on or in an upper pad, and thus solder balls as connection terminals may be prevented from excessively outwardly spreading during a pressing step of a thermo-compression process. In an implementation, the connection terminal may be introduced into the recess, and the connection terminal may be inhibited from extremely growing left and right (e.g., from flowing outwardly). Thus, it is possible to help prevent contact between neighboring connection terminals. In an implementation, the connection terminals may be free of short-circuit defects. In an implementation, the semiconductor package may increase in yield.

In a semiconductor package and its fabrication method in accordance with some example embodiments, a width of a recess on an upper pad on or at a central region (e.g., toward an interior of) a top surface of a first semiconductor chip may be greater than a width of a recess on an upper pad on or at an outer region, e.g., a region outside the central region. In an implementation, semiconductor chips may have central regions that are bent into a downwardly convex curved shape. In an implementation, a semiconductor chip may be configured such that a connection terminal at a central region thereof is closer than others to the first semiconductor chip. In this case, the connection terminal at the central region may be strongly compressed in a thermo-compression process. When the recess at the central region has a relatively larger width, the connection on the central region may be prevented from excessively protruding outwardly, even when being strongly compressed. In an implementation, the recess at the central region may have a relatively large width, and the connection terminal may be introduced into the recess and may thus be prevented from excessively spreading outwardly. Accordingly, it may be possible to avoid short-circuit between neighboring connection terminals on the central region.

In a semiconductor package and its fabrication method in accordance with some example embodiments, a wide recess may be on the upper pad on the central region, the connection terminal may be prevented from spreading, and the second semiconductor chip may be compressed with a sufficiently large pressure in the thermo-compression process. As the second semiconductor is compressed with a large pressure, it is possible to allow upper pads to uniformly contact connection terminals on the outer region, and before being compressed, which are relatively far from the first semiconductor chip. Thus, non-wet issues may be prevented between pads and solder balls.

In a semiconductor package and its fabrication method in accordance with some example embodiments, short-circuits and non-wet issues may be avoided even when small-pitched upper pads and solder balls are used. In an implementation, fine-pitched solder balls may be used.

In a semiconductor package and its fabrication method in accordance with some example embodiments, the recess may have a depth less than a thickness of the upper pad. In an implementation, after the thermo-compression bonding, the connection terminal may be in contact with a recess surface of the upper pad. In an implementation, the connection terminal may have a surface contact with the recess surface of the upper pad (e.g., the bottom of the recess), and contact defects may be prevented. In an implementation, the connection may not directly contact a through silicon via (TSV) or the like, and therefore, a uniform bonding may be achieved in a bonding step.

In a semiconductor package and its fabrication method in accordance with some example embodiments, the upper pad may have an extension aperture that horizontally extends from the recess. In an implementation, even if the connection terminal and the upper pad were not uniformly bonded due to insufficient compression when the connection terminal shaped like a ball is coupled to the upper pad, it is possible to prevent the occurrence of void between the recess surface and the connection terminal. In such a case, the extension aperture may be spatially connected or open to the outside (e.g., of the recess), and it is possible to avoid the formation of an empty space completely surrounded by the connection terminal and the upper pad. In an implementation, the connection terminal and the upper pad may be prevented from problems such as contact failure resulting from expansion of the void.

Figure 18:
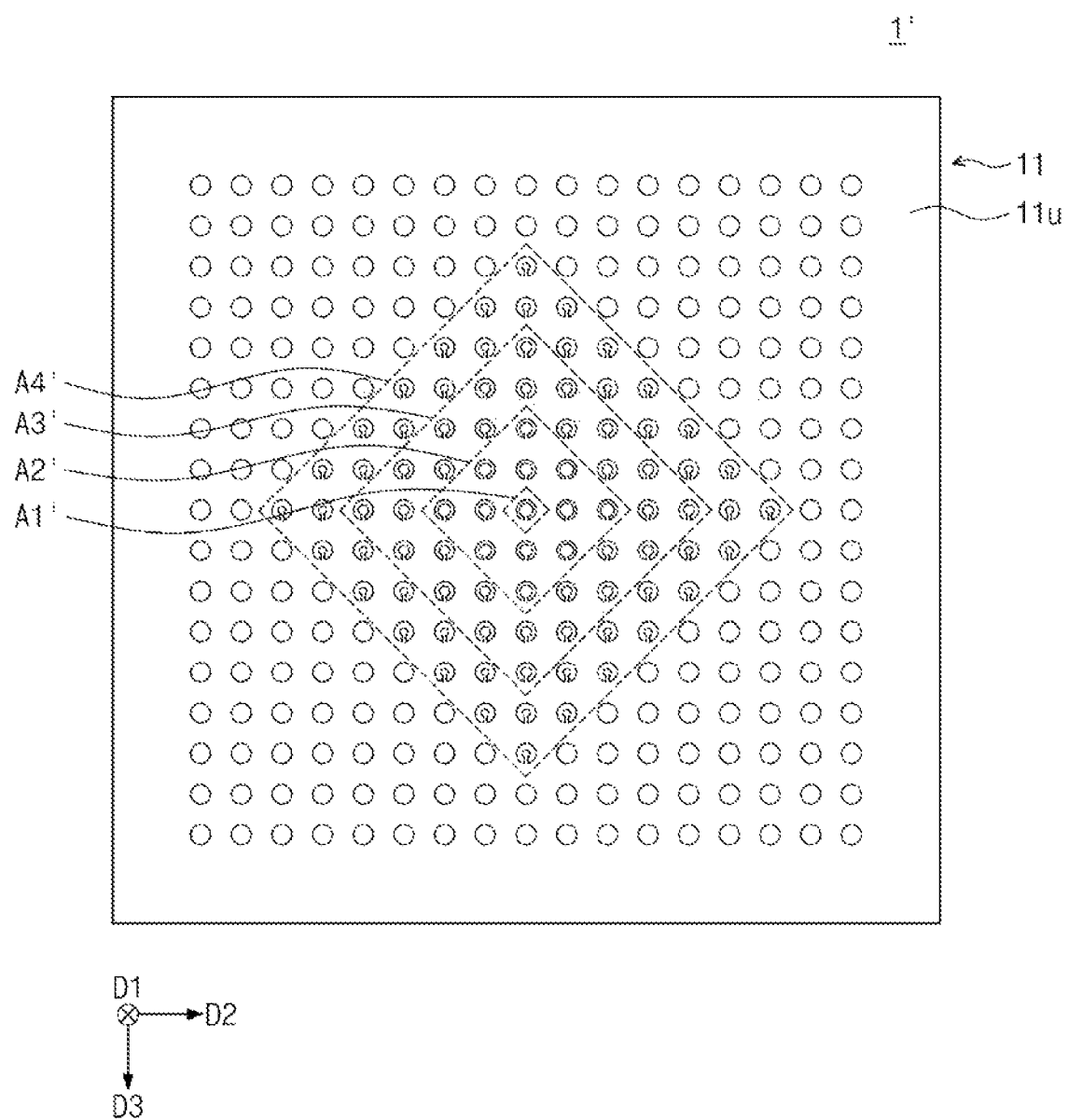
FIG. 18 illustrates a plan view of a first semiconductor chip of a semiconductor package according to some example embodiments.

FIG. 18 illustrates a plan view of a first semiconductor chip of a semiconductor package according to some example embodiments.

For convenience, the following may omit repeated descriptions substantially the same as or similar to that discussed with reference to FIGS. 1 to 16.

Referring to FIG. 18, a semiconductor package 1' may include a first semiconductor chip that has, on its top surface 11u, a first region A1', a second region A2', a third region A3', and a fourth region A4' whose shapes are different from those discussed with reference to FIG. 3. In an implementation, differently from that discussed with reference to FIG. 3, each of the first, second, third, and fourth regions A1', A2', A3', and A4' may have four sides that are not parallel to four sides of the top surface 11u. In an implementation, each side of the first, second, third, and fourth regions A1', A2', A3', and A4' may make an angle of about 45 degrees relative to four sides of the top surface 11u.

In an implementation, regions may have shapes as depicted in FIG. 3 or 18. In an implementation, the first to fourth regions may have shapes that are inclined outwardly or are variously changed.

By way of summation and review, a reflow or thermo-compression (TC) process may be employed to use solder balls or the like to connect and couple semiconductor chips to each other. For the thermo-compression process, heat may be applied to the stacked semiconductor chips that are compressed downwardly.

In a semiconductor package of an embodiment, short-circuits may be prevented to help increase reliability.

In a semiconductor package of an embodiment, non-wet issues may be avoided.

In a semiconductor package of an embodiment, fine-pitched solder balls may be used.

In a semiconductor package of an embodiment, the formation of voids may be inhibited between solder balls and upper pads.

One or more embodiments may provide a semiconductor package whose reliability is increased due to the prevention of short-circuit that could occur in a thermo-compression process.

One or more embodiments may provide a semiconductor package capable of preventing short-circuits to increase reliability.

One or more embodiments may provide a semiconductor package capable of preventing non-wet phenomena.

One or more embodiments may provide a semiconductor package capable of using solder balls having fine pitches.

One or more embodiments may provide a semiconductor package capable of preventing the generation of voids between solder balls and upper pads.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a substrate;
a first semiconductor chip on the substrate;
a second semiconductor chip on the first semiconductor chip; and
at least one connection terminal between the first semiconductor chip and the second semiconductor chip,
wherein:
the first semiconductor chip includes:
a first semiconductor chip body; and
at least one upper pad on a top surface of the first semiconductor chip body and in contact with the at least one connection terminal,
the at least one upper pad includes a recess that is downwardly recessed from a top surface thereof,
a depth of the recess is less than a thickness of the at least one upper pad,
the at least one upper pad includes:
a first upper pad;
a plurality of second upper pads at an outer side of the first upper pad; and
a plurality of third upper pads at an outer side of the plurality of second upper pads,
the recess of the first upper pad is a first recess,
the recess of each of the second upper pads is a second recess, and
a width of the first recess is greater than a width of the second recess.

2. The semiconductor package as claimed in claim 1, wherein:
the at least one connection terminal includes:
a first connection terminal connected to the first upper pad;
a plurality of second connection terminals connected to corresponding ones of the plurality of second upper pads; and
a plurality of third connection terminals connected to corresponding ones of the plurality of third upper pads, and
a portion of the first connection terminal is in the first recess.

3. The semiconductor package as claimed in claim 2, wherein the second semiconductor chip includes:
a second semiconductor chip body; and
a plurality of connection pads on a bottom surface of the second semiconductor chip body and connected to corresponding ones of the first, second, and third connection terminals.

4. The semiconductor package as claimed in claim 3, wherein:
thicknesses of the plurality of connection pads are each about 2 μm to about 4 μm, and
thicknesses of the first, second, and third upper pads are each about 2 μm to about 4 μm.

5. The semiconductor package as claimed in claim 1, wherein the widths of the first recess and the second recess are each independently about 3 μm to about 15 μm.

6. The semiconductor package as claimed in claim 1, wherein a horizontal distance between neighboring ones of the first upper pad, the second upper pad, and the third upper pad is about 20 μm to about 40 μm.

7. The semiconductor package as claimed in claim 1, wherein:
the first upper pad further includes a first extension aperture that laterally extends from the first recess and penetrates in a horizontal direction through the first upper pad, and
the plurality of second upper pads each further include a second extension aperture that laterally extends from the second recess and penetrates in a horizontal direction through the plurality of second upper pads.

8. The semiconductor package as claimed in claim 1, wherein:
the first semiconductor chip includes a logic chip, and
the second semiconductor chip includes a static random access memory.

9. The semiconductor package as claimed in claim 1, wherein the first semiconductor chip body includes a through silicon via.

10. A semiconductor package, comprising:
a first chip;
a second chip on the first chip; and
at least one connection terminal between the first chip and the second chip,
wherein:
the first chip includes:
a first chip body; and
at least one upper pad on a top surface of the first chip body and connected to the at least one connection terminal,
the at least one upper pad includes:
an upper pad body;
a recess that is downwardly recessed from a top surface of the upper pad body; and
an extension aperture that laterally extends from the recess and penetrates in a horizontal direction through the upper pad body, and
a portion of the at least one connection terminal is in the recess.

11. The semiconductor package as claimed in claim 10, wherein:
the at least one upper pad includes a plurality of upper pads,
the at least one connection terminal includes a plurality of connection terminals,
one upper pad of the plurality of upper pads includes the recess and the extension aperture, and another upper pad of the plurality of upper pads does not include the recess and does not include the extension aperture.

12. The semiconductor package as claimed in claim 11, wherein:
the plurality of upper pads includes:
a first upper pad; and
a plurality of second upper pads outside the first upper pad,
the recess of the first upper pad is a first recess that is downwardly recessed,
the recess of each of the second upper pads is a second recess that is downwardly recessed, and
a width of the first recess is greater than a width of the second recess.

13. The semiconductor package as claimed in claim 12, where the widths of the first and second recesses are each about 3 μm to about 15 μm.

14. The semiconductor package as claimed in claim 11, wherein:
the second chip includes:
a second chip body; and
a plurality of connection pads on a bottom surface of the second chip body and correspondingly connected to the plurality of connection terminals,
thicknesses of the plurality of connection pads are each about 2 μm to about 4 μm, and
thicknesses of the plurality of upper pads are each about 2 μm to about 4 μm.

15. The semiconductor package as claimed in claim 10, wherein:
a first chip includes a logic chip, and
a second chip includes a static random access memory.

16. The semiconductor package as claimed in claim 10, wherein the first chip includes a through silicon via.

17. A semiconductor package, comprising:
a substrate;
a first semiconductor chip on the substrate;
a second semiconductor chip on the first semiconductor chip; and
connection terminals between the first semiconductor chip and the second semiconductor chip,
wherein:
the first semiconductor chip includes:
a first semiconductor chip body; and
upper pads on a top surface of the first semiconductor chip body and connected to the connection terminals,
the upper pads include:
a first upper pad on a first region at a center of the top surface of the first semiconductor chip body;
a plurality of second upper pads on a second region outside the first region; and
a plurality of third upper pads on a third region outside the second region, the first upper pad includes:
a first upper pad body;
a first recess that is downwardly recessed from a top surface of the first upper pad body; and
a first extension aperture that laterally extends from the first recess and penetrates in a horizontal direction through the first upper pad body,
each of the second upper pads includes:
a second upper pad body;
a second recess that is downwardly recessed from a top surface of the second upper pad body; and
a second extension aperture that laterally extends from the second recess and penetrates in a horizontal direction through the second upper pad body,
a width of the first recess is greater than a width of the second recess,
the connection terminals include:
a first connection terminal connected to the first upper pad;
a plurality of second connection terminals connected to corresponding second upper pads; and
a plurality of third connection terminals connected to corresponding third upper pads, and
a portion of the first connection terminal is in the first recess.

18. The semiconductor package as claimed in claim 17, wherein:
the first semiconductor chip includes a logic chip, and
the second semiconductor chip includes a static random access memory.

19. The semiconductor package as claimed in claim 17, where the widths of the first and second recesses are each about 3 μm to about 15 μm.

* * * * *